(12) United States Patent
Cheng et al.

(10) Patent No.: US 11,567,415 B2
(45) Date of Patent: Jan. 31, 2023

(54) INSPECTION SYSTEM FOR EXTREME ULTRAVIOLET (EUV) LIGHT SOURCE

(71) Applicant: Taiwan Semiconductor Manufacturing Company, Ltd., Hsinchu (TW)

(72) Inventors: Chiao-Hua Cheng, Tainan (TW); Shang-Chieh Chien, New Taipei (TW); Heng-Hsin Liu, New Taipei (TW); Li-Jui Chen, Hsinchu (TW); Sheng-Kang Yu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 11 days.

(21) Appl. No.: 17/382,955

(22) Filed: Jul. 22, 2021

(65) Prior Publication Data

US 2022/0326624 A1 Oct. 13, 2022

Related U.S. Application Data

(60) Provisional application No. 63/172,956, filed on Apr. 9, 2021.

(51) Int. Cl.
*G03F 7/20* (2006.01)
*G06T 7/00* (2017.01)
*H04N 5/232* (2006.01)
*H04N 5/225* (2006.01)

(52) U.S. Cl.
CPC ...... *G03F 7/70591* (2013.01); *G03F 7/70033* (2013.01); *G06T 7/001* (2013.01); *H04N 5/23299* (2018.08); *G06T 2207/20224* (2013.01); *H04N 2005/2255* (2013.01)

(58) Field of Classification Search
None
See application file for complete search history.

(56) References Cited

FOREIGN PATENT DOCUMENTS

| CN | 103676496 B | * | 6/2017 | ............... G03F 7/20 |
|---|---|---|---|---|
| CN | 207611498 U | * | 7/2018 | |
| JP | 2011165943 A | * | 8/2011 | |
| KR | 20160059860 A | * | 5/2016 | |

* cited by examiner

*Primary Examiner* — Shadan E Haghani
(74) *Attorney, Agent, or Firm* — Fay Sharpe LLP

(57) ABSTRACT

A method for inspecting an extreme ultraviolet (EUV) light source includes: removing a collector mirror of the EUV light source from a collector chamber; installing an inspection apparatus within the collector chamber, the apparatus including a selectively extendable and retractable member and a camera at one end of the member; operating a first actuator to extend the member along a path through the interior chamber of the EUV light source, thereby moving the camera to a given position within the interior chamber of the EUV light source; operating a second actuator to pan the camera about an axis of rotation, thereby establishing a given camera orientation within the interior of the EUV light source; and, capturing an image of the interior chamber of the EUV light source with the camera while the camera is at the given position and orientation established by the operation of the first and second actuators.

20 Claims, 7 Drawing Sheets

INSPECTION SYSTEM FOR EXTREME ULTRAVIOLET (EUV) LIGHT SOURCE

PRIORITY CLAIM AND CROSS-REFERENCE

This application claims the benefit of U.S. Provisional Patent Application No. 63/172,956, filed Apr. 9, 2021, which is incorporated by reference herein in its entirety.

BACKGROUND

The following relates to extreme ultraviolet (EUV) lithography, in particular to an inspection method, apparatus and/or system for inspecting an EUV light source of the type used in EUV lithography, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
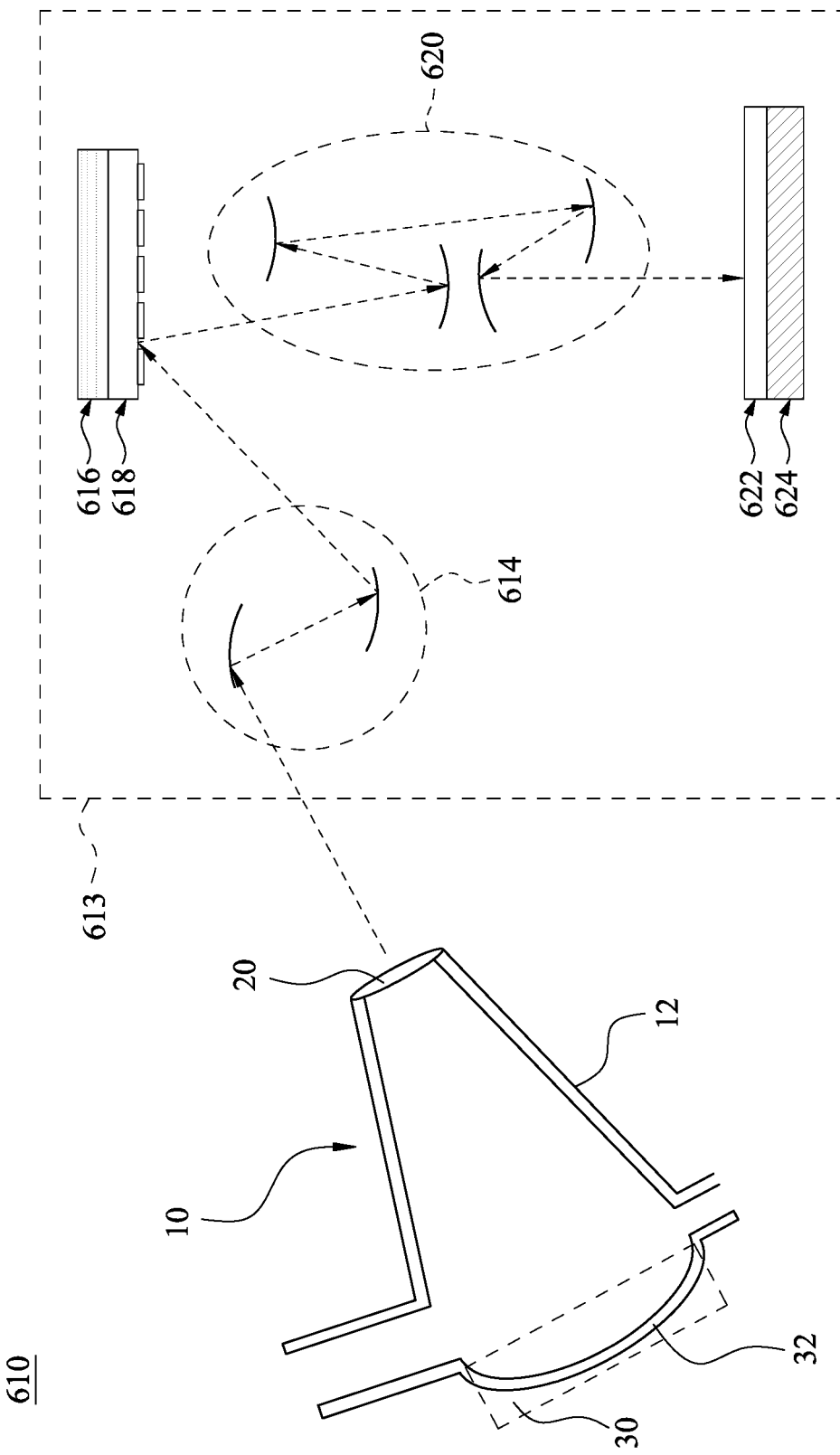
FIG. 1 diagrammatically illustrates a photolithography system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows an extreme ultraviolet (EUV) photolithography system 610 in accordance with some embodiments of the present disclosure. Suitably, the system 610 is operable to perform lithography exposing processes with a respective radiation source and exposure mode. FIG. 1 shows a EUV light source 10 injecting EUV light through an intermediate focus (IF) cap 20 into a EUV scanner 613 including an illuminator 614 that illuminates a mask 618 (sometimes referred to as a reticle) that is secured on a mask stage 616 by an electrostatic chuck (e-chuck) or the like. Suitably, for an EUV lithography system, the mask 618 is a reflective mask. A projection system 620 (sometimes referred to as a projection optics box, POB) of the EUV scanner 613 projects the image of the mask 618 onto a wafer 622 (for example, a silicon wafer on which integrated circuit fabrication is being performed) mounted on a substrate stage 624 by an e-chuck or the like and coated with photoresist to perform the EUV exposure. In some embodiments, the light source 10 generates EUV radiation (or light) with a wavelength centered at about 13.5 nm. Suitably, the projection optics module 620 includes reflective optics (for EUV) that are configured to image the pattern of the mask 618 onto the semiconductor wafer 622 secured on the substrate stage 624 of the lithography system 610. In practice, various elements can be added to and/or omitted from the lithography system 610, and the disclosed embodiments herein are not meant to be limited by that which is shown in FIG. 1.

Figure 2:
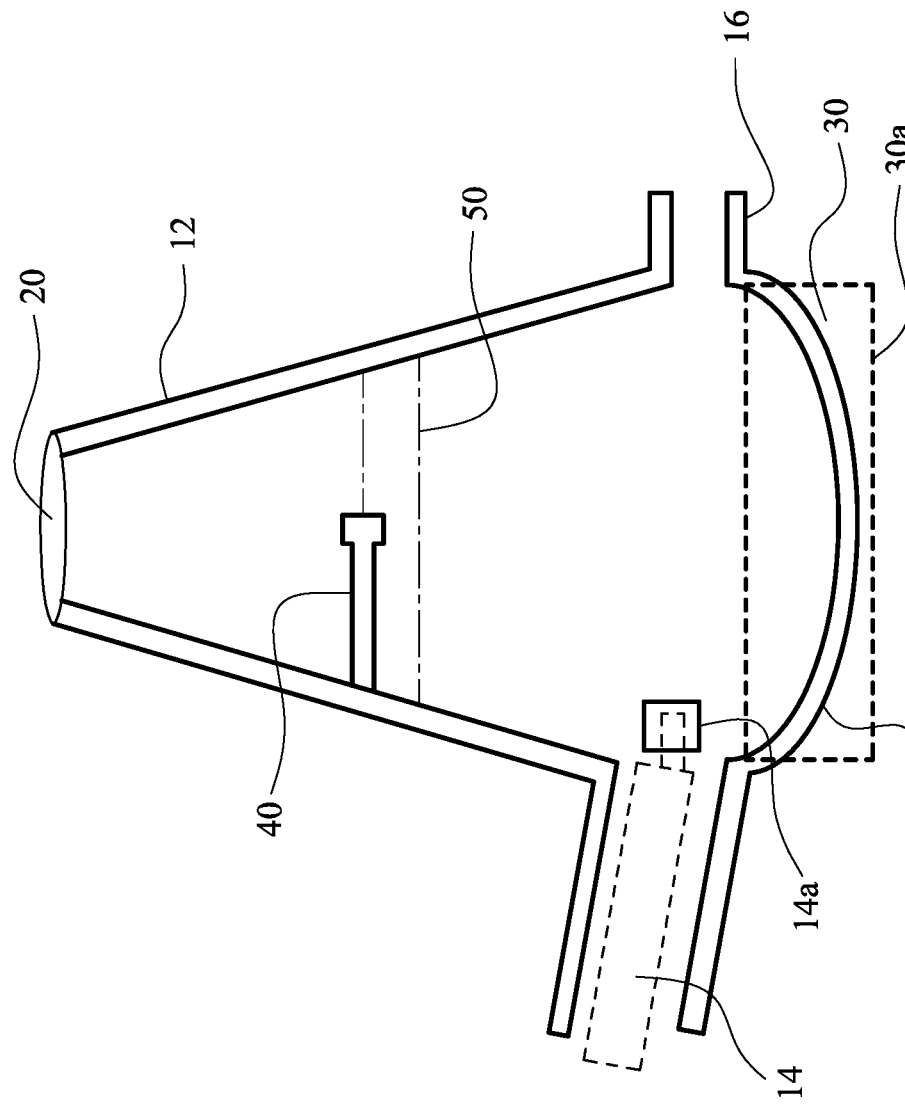
FIG. 2 diagrammatically illustrates a EUV light source in accordance with some embodiments.

FIG. 2 shows an example EUV light source 10 of the type used in EUV lithography and which may be inspected in accordance with some embodiments disclosed herein. For example, the EUV light source 10 shown in FIG. 2 may be used as and/or correspond to the light source 10 shown in FIG. 1. As illustrated in FIG. 2, the EUV light source 10 is generally formed from a housing or vessel 12 having at one end thereof an intermediate focus (IF) cap 20 including a hole therein through which generated EUV light exits the EUV light source 10 and at another opposing end a collector chamber 30 in which a collector mirror 32 is located and/or housed. In practice, the EUV light and/or radiation generated by the EUV light source 10 exits the EUV light source 10 through the IF cap 20 and upon exiting through the IF cap 20 it proceeds, travels and/or is directed toward and/or to the optical module of the lithography system 610, i.e., more specifically, toward and/or to the illuminator 614. In one suitable embodiment, the housing or vessel 12 and/or the walls thereof generally form a frustoconical shape. In some other embodiments, a generally cylindrical or other suitable shape may be taken. In practice, the walls of the housing or vessel 12, the IF cap 20 and the collector chamber 30 (when the collector mirror 32 is installed therein) cooperate to define an environmentally controlled chamber in which EUV radiation and/or light is generated, collected and/or focused. During operation of the EUV light source 10, as this environmentally controlled chamber is generally maintained at a pressure significantly below conventional atmospheric pressure, it is at times referred to and/or known as a vacuum chamber, although strictly speaking it may not in fact be at an absolute vacuum during operation of the EUV light source 10.

In one suitable embodiment, the EUV light source 10 is a laser-produced plasma (LPP) EUV light source, such as a pulsed tin plasma EUV light source. In operation, the EUV light source 10 may be driven by a high power laser (not shown) such as a carbon dioxide ($CO_2$) laser or other pulsed laser that injects or shoots a pulsed laser beam into the vacuum (or other environmentally controlled) chamber, for example, via an optical window. In some embodiments, the laser beam is injected from under or behind the collector mirror 32 and passes through a small hole, aperture or opening arranged at or near a center of the collector mirror 32. In some embodiments, the collector mirror 32 is a multi-layer construction forming a reflective mirror at and/or about the operative wavelength of the EUV light source 10. The collector mirror 32 may be elliptical mirror that has one focus at or near an ignition site (i.e., where the laser beam strikes a target) and a second focus at or near the IF cap 20.

A target droplet generator 14 injects droplets of a target material (for example, tin) through a port 14a into the environmentally controlled chamber of the EUV light source 10. The target droplet is generally propelled toward a droplet catcher 16 on an opposing side of the environmentally controlled chamber of the EUV light source 10. Suitably, the optical pulses of the laser are timed to impinge on the target droplets (for example, at or near the ignition site) as they pass through the vacuum chamber to produce a plasma which generates extreme ultraviolet (EUV) radiation and/or light, for example, having wavelengths, roughly spanning a 2% FWHM (full-width half-maximum) bandwidth in a range centered somewhere around 13.5 nm. In one embodiment, the EUV light source 10 produces EUV radiation and/or light having a wavelength ranging between about 1 nm and about 100 nm. The collector mirror 32 (when suitably installed in the collector chamber 30) operates to reflect and/or focus the plasma generated EUV radiation toward the IF cap 20, through which the EUV light exits the EUV light source 10. Upon exiting, the EUV light from the source 10 may by further shaped and/or directed by an optical system to form a EUV light beam for use in EUV lithography.

In practice, the EUV light source 10 may include other components known in the art, for example, such as a buffer gas system, including a buffer gas source, that flows and/or establishes a buffer gas (for example, hydrogen) within the environmentally controlled chamber to aid in the reduction of environmental contamination, atomic tin deposition and/or residue built-up in the chamber. In some embodiments, a number of vanes (not shown) may be formed on and distributed around an inner wall of the vessel or housing 12 to provide receiving surfaces for target droplets that may go astray. That is to say, some target droplets and/or fragments thereof produced by interaction with the laser pulses, on occasion, may not travel strictly in the desired path toward the droplet catcher 16, and when they are incident on the inner wall(s) of the vessel or housing 12, the vanes act to retain the tin or other liquid target material. The vanes are optionally heated to above the melting temperature of the material of the target droplets using any suitable manner of heating. In addition, a gutter (not shown) may be provided at one end of the vanes and connected to a drain (not shown) in order to recover the stray target material flowing from and/or along the vanes. It is noted that while the vessel or housing 12 is illustrated oriented vertically, in practice it may be installed tilted at an angle.

As shown in FIG. 2, for example, a horizontal obstruction (HO) bar 40 is optionally installed in the EUV light source 10. The HO bar 40 operates to and/or aids in blocking laser light from exiting through the IF cap 10 when it is not impinging upon target droplets. Also shown in FIG. 2 is a scrubber 50 which operates to and/or aids in removing and/or otherwise cleaning contaminates, particles, residue and the like from any buffer or other gas used in the environmentally controlled chamber.

In one particular embodiment, the collector mirror 32 is suitably contained in a drawer or the like which is selectively placed and/or housed in the collector chamber 30. In one suitable embodiment, the drawer containing the collector mirror 32 is selectively positioned in or out of the collector chamber 30. During operation of the EUV light source 10, the drawer is placed and/or positioned in the collector chamber 30 thereby installing the collector mirror 32 in the EUV light source 10 so that it may collect and/or focus the generated EUV radiation created as the periodically or intermittently injected target droplets are struck by the laser pulses. During down time or when the EUV light source 10 is otherwise not in operation, the drawer containing the collector mirror 32 may be selectively removed from and/or positioned outside the collector chamber 30, for example, to allow for the ready inspection, cleaning, maintenance and/or replacement of the collector mirror 32. When the drawer containing the collector mirror 32 is removed from the collector chamber 30, this also grants one access through the collector chamber 30 to the interior (i.e., the otherwise environmentally controlled chamber) of the EUV light source 10, thereby permitting the inspection, cleaning and/or maintenance thereof.

In existing EUV light source maintenance approaches, an operator enters into the collector chamber 30 and uses a rod-mounted camera to acquire photographs of tin residue on the IF cap 20. Because the collector chamber door is a narrow space, the operator performing this inspection process may need to be of slim profile. Physical entry of the operator into the collector chamber also exposes the operator to tin particles, so that the operator must wear an active air-supply mask for safety, further encumbering the operator in performing the inspection task. Donning the active air-supply mask also takes time, and the mask is not comfortable. Still further, holding the rod-mounted camera still for extended time periods is exhausting for the operator.

Figure 3:
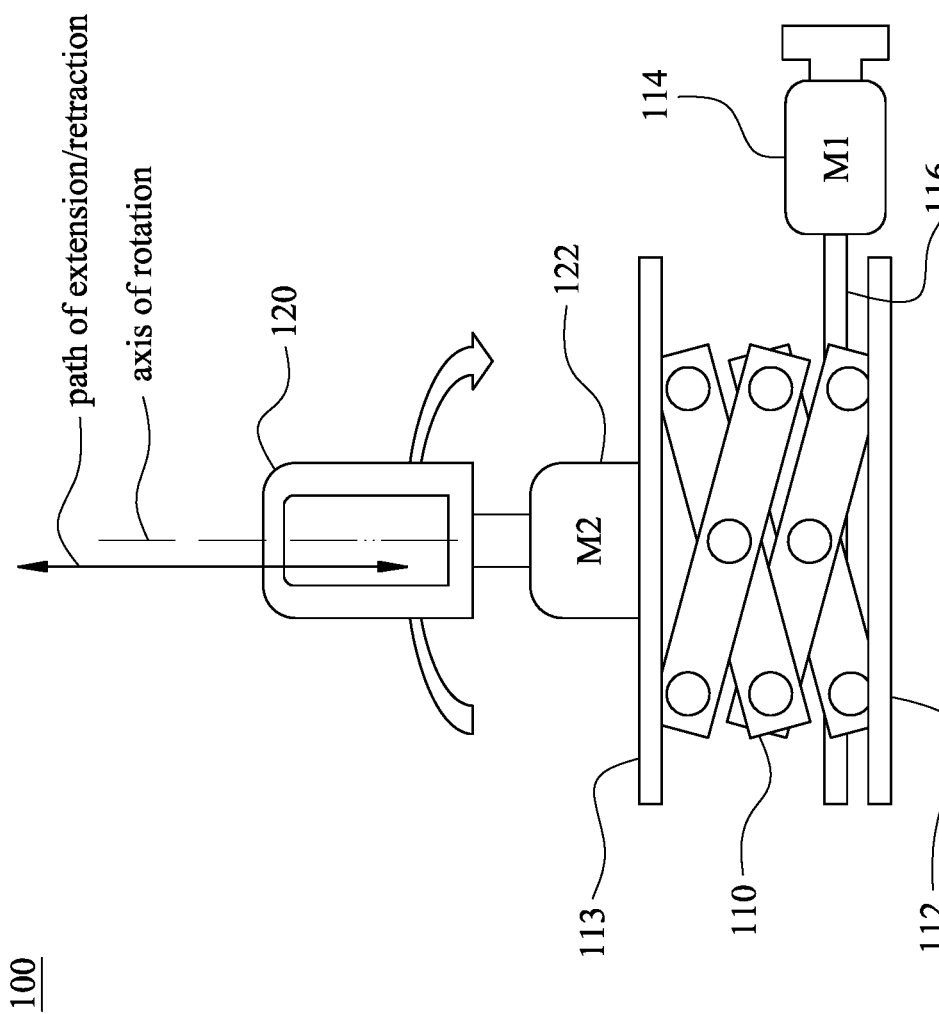
FIG. 3 diagrammatically illustrates a remotely operated inspection apparatus in accordance with some embodiments.
Figure 4:
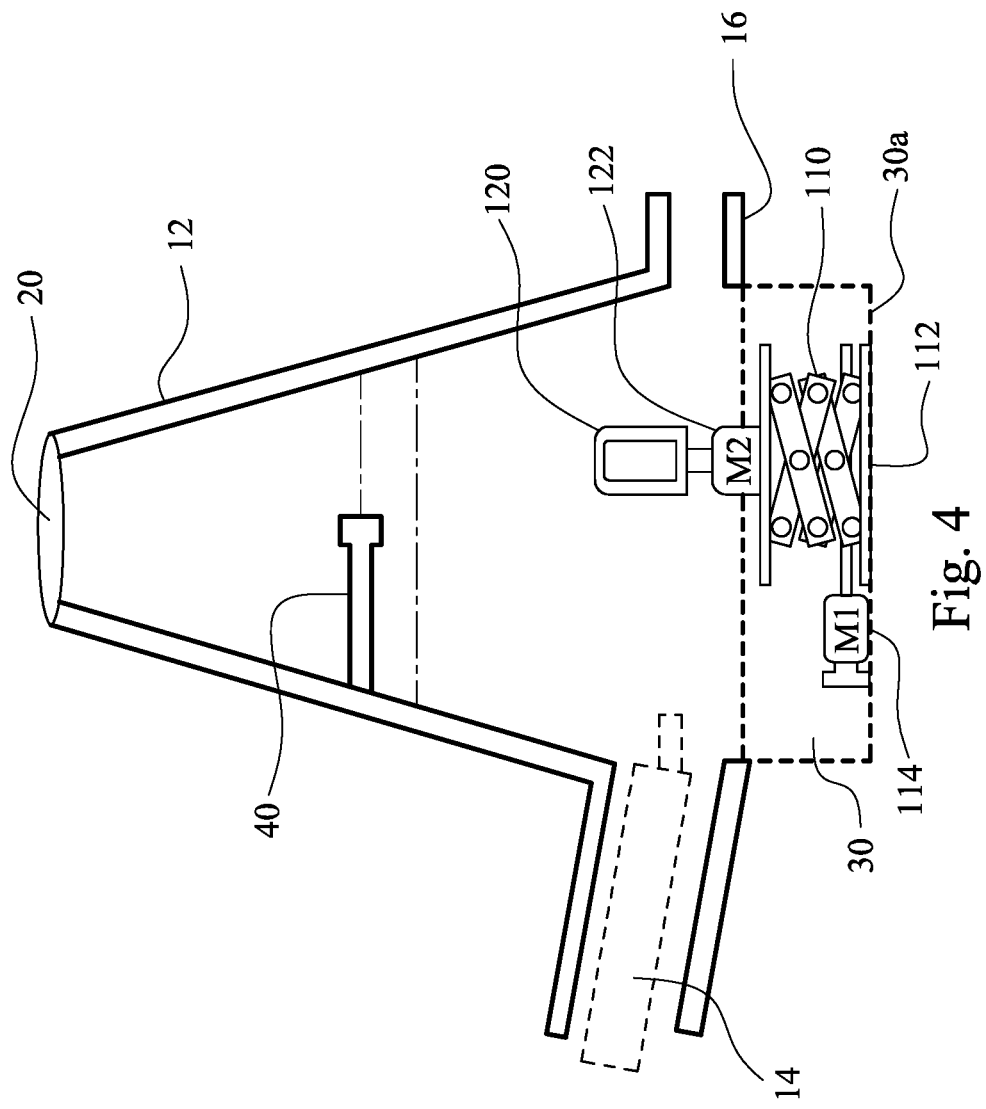
FIG. 4 diagrammatically illustrates one view of the inspection apparatus of FIG. 3 installed in the EUV light source of FIG. 2 in accordance with some embodiments.
Figure 5:
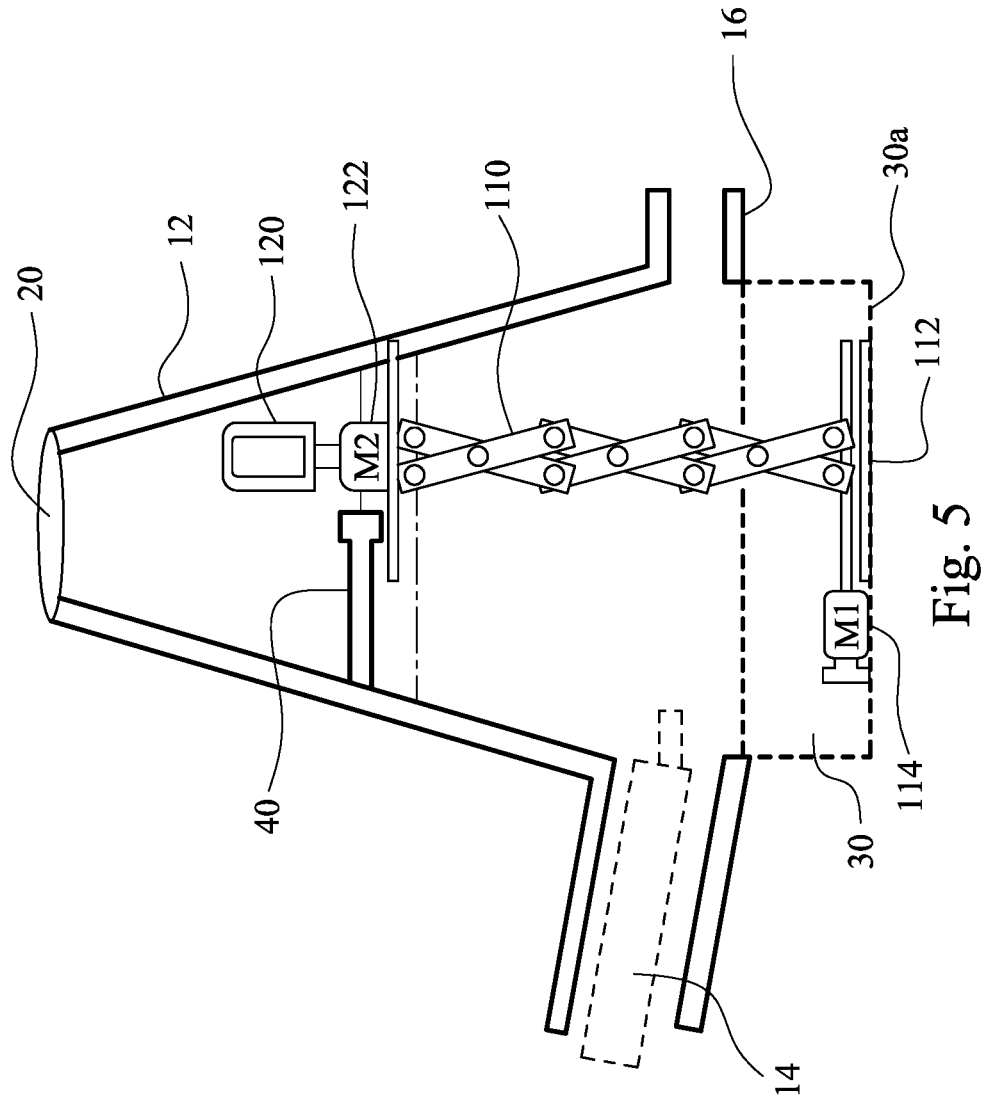
FIG. 5 diagrammatically illustrates another view of the inspection apparatus of FIG. 3 installed in the EUV light source of FIG. 2 in accordance with some embodiments.

In accordance with embodiments disclosed herein, the safe inspection of an EUV light source 10 can be conveniently conducted by a remote operator of an inspection apparatus 100 (shown in isolation in FIG. 3 and in use in FIGS. 4 and 5). In particular, via the remotely controlled inspection apparatus 100, an operator conveniently conducts thorough inspections of one or more various interior components of the EUV light source 10 from outside the vessel or housing 12 of the EUV light source 10, thereby avoiding the inconvenience of having to awkwardly position himself or herself within the EUV light source 10 where there may be the potential for exposure to tin residue or other potentially harmful exposures and/or where he may accidentally cause damage to a sensitive portion or component of the EUV light source 10.

In some exemplary embodiments, the inspection apparatus 100 includes a remotely operated, actuator-controlled mechanical linkage that moves, orients, positions and/or otherwise manipulates a suitable camera and/or other sensor held at an operative end thereof. The actuator may be an electric motor, a pneumatic actuator, a hydraulic actuator or other suitable actuator. Suitably, the mechanical linkage (referred to herein as a lift device 110) is selectively extendable and/or retractable and may comprise, for example, a scissor lift, a telescopic or other suitable piston and cylinder arrangement, or other appropriate extendable/retractable mechanical configurations. In practice, the inspection apparatus 100 is selectively placed within the collector chamber 30 while the drawer containing the collector mirror 32 has been removed therefrom. The inspection apparatus 100 is remotely controlled and/or operated to perform an inspection of the interior (i.e., the vacuum chamber) of the EUV light source 10 using the camera and/or other sensor(s) equipped on the inspection apparatus 100.

FIG. 3 illustrates one suitable embodiment of the inspection apparatus 100. As shown, the inspection apparatus 100 comprises a bottom plate or base 112 which supports the lift device 110 thereon, the lift device 110 being a selectively extendable and/or retractable mechanical linkage, for example, such as the illustrated scissor lift. As illustrated, an electric motor 114 selectively turns a lead-screw 116 or the like to selectively extend and/or retract the scissor lift. A camera 120 is held and/or arranged at an end of the lift device 110 opposite the base 112, for example, on a top plate 113.

Optionally, alternate types of actuators, for example, hydraulic, pneumatic, electromechanical or electrohydraulic, may be employed to selectively extend and/or retract the lift device 110. In accordance with some embodiments, a telescoping piston and cylinder arrangement and/or other suitable extendable/retractable mechanisms may be used as the lift device 110, for example, in place of the illustrated scissor lift.

In suitable embodiments, the camera 120 is optionally a digital camera that selectively captures video and/or still images within a field of view (FoV) of the camera 120. The camera 120 suitably operates in a visible range of the light spectrum to capture color images, black and white images or gray-scale images and/or may operate in other ranges of the light spectrum, for example, infrared, ultraviolet, etc., to capture images in those respective ranges of the light spectrum. As shown, a further actuator, for example, such as an electric motor 122, is arranged to selectively pan and/or rotate the camera 120 about an axis, thereby panning, rotating and/or orienting the FoV of the camera 120 accordingly. In some embodiments, yet a further actuator (not shown) is arranged on the inspection apparatus 100 to selectively tilt the camera 120 about pivot point, for example, up and/or down in a vertical or other plane. As with the other actuators, the tilt actuator may be an electric motor or other suitable actuator. The combined tilt and/or pan of the camera 120 cooperate to establish the orientation of the camera 120 and/or its FoV atop the lift device 110. In some embodiments, the tilt may also be used to move the camera 120 parallel with the bottom plate or base 112 to reduce the profile of the inspection apparatus 100 so as to facilitate inserting it through the collector chamber door.

To use the inspection apparatus 100, the drawer containing the collector mirror 32 is removed from the collector chamber 30 and the inspection apparatus 100 is placed in the collector chamber 30. Suitably, when installed, the inspection apparatus 100 rests with its base 112 on a floor 30a of the collector chamber 30. In one suitable embodiment, gravity and/or friction (i.e., between the base 112 and floor 30a) keep the inspection apparatus 100 in place where it is set on the floor 30a of the collector chamber 30. In some embodiments, the base 112 of the inspection apparatus 100 may be removably connected and/or affixed to the floor 30a, for example, via a mechanical, magnetic, adhesive, suction or other appropriate mechanism.

In some suitable embodiments, the floor 30a of the collector chamber 30 is provided with one or more registration marks or the like indicating the appropriate location thereon where the base 112 of the inspection apparatus 100 is to be placed. The registration marks ensure that the inspection apparatus 100 may be readily positioned on the floor 30a of the collector chamber 30, reliably and repeatedly, at the same location. In some suitable embodiments, one or more detents, mated pins and/or holes, tabs, retaining members, connectors and/or other positioning devices are included on the floor 30a and/or base 112, which act and/or cooperate to position and/or selectively retain the base 112 of the inspection apparatus 100 in a set location on the floor 30a of the collector chamber 30.

FIG. 4 shows one view of the inspection apparatus 100 of FIG. 3 installed in the EUV light source 10 of FIG. 2, for example, with the lift device 110 fully or nearly fully retracted. FIG. 5 shows another view of the inspection apparatus 100 of FIG. 3 installed in the EUV light source 10 of FIG. 2, for example, with the lift device 110 fully or nearly fully extended.

Figure 6:
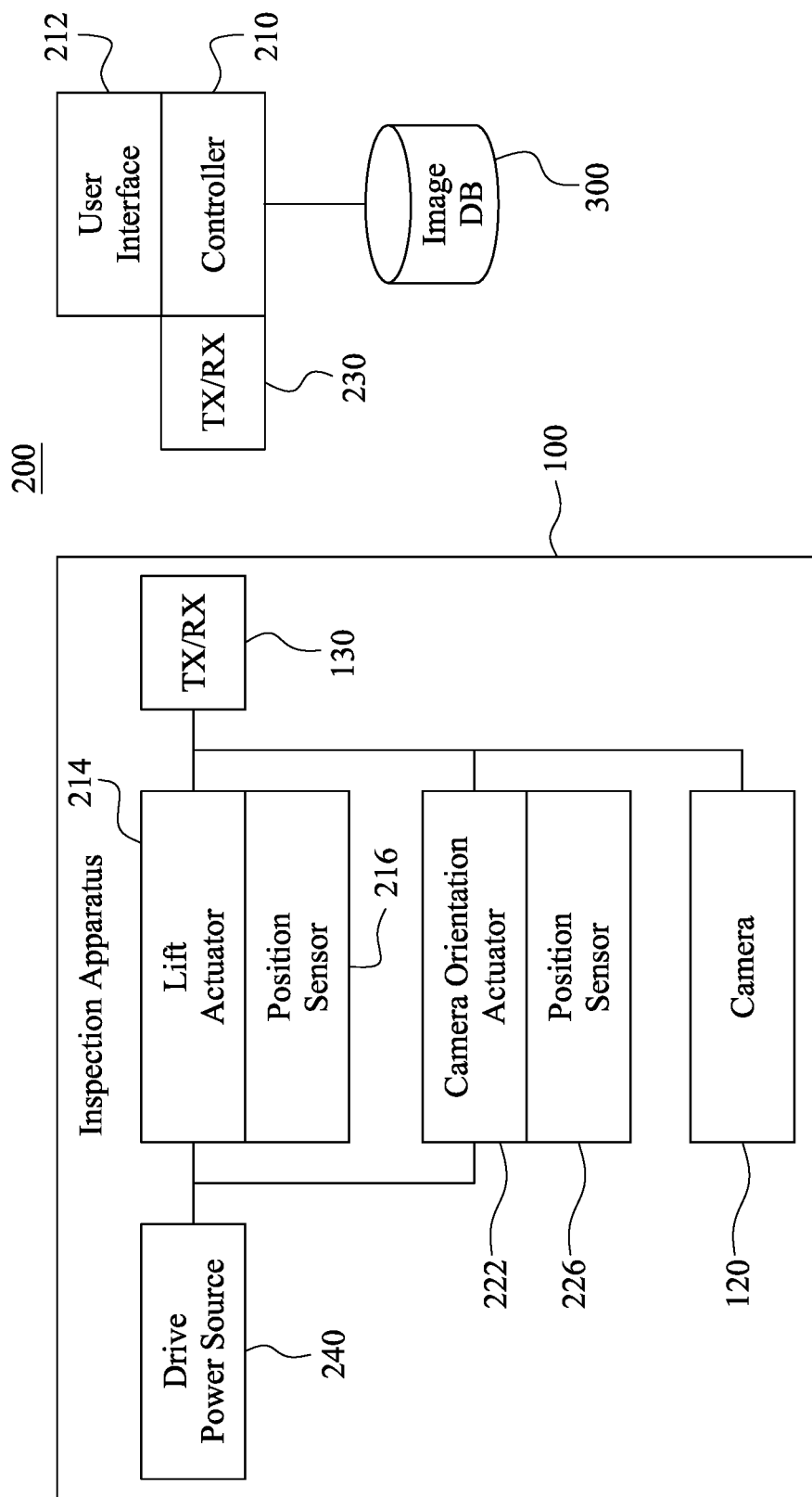
FIG. 6 diagrammatically illustrates an inspection system that incorporated the herein disclosed inspection apparatus in accordance with some embodiments.

With reference to FIG. 6, an inspection system 200 is shown which incorporates the inspection apparatus 100. In the illustrated embodiment, the inspection apparatus 100 includes the camera 120, a lift actuator 214 (for example, which may comprise the motor 114 shown in FIG. 3), and a camera orientation actuator 222 (for example, which may comprise the motor 122 shown in FIG. 3). Suitably, the aforementioned tilt actuator (not shown) is also optionally included.

In practice, the inspection apparatus 100 is remotely controlled by a controller 210 that remains remotely located (for example, outside the EUV light source 10 and/or the collector chamber 30) from the inspection apparatus 100, while still in operative communication therewith when the inspection apparatus 100 is installed in the collector chamber 30.

Suitably, the controller 210 be implemented via hardware, software, firmware or a combination thereof. In particular, the controller 210 may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying the controller 210 may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

As shown, the controller 210 and inspection apparatus 100 communicate wirelessly via suitably provisioned transceivers 230 and 130, for example, using a radio frequency (RF), Bluetooth, near RF (nRF), Wi-Fi, cellular or other suitable wireless communication protocol. Alternately, a wired connection (for example, Ethernet) is provided over which the controller 210 and inspection apparatus 100 communicate.

As shown, the controller 210 is provisioned with a user interface 212, including one or more suitable input and/or output devices, for example, such as a touchscreen or other display, keyboard, mouse, etc. Via the user interface 212, an operator may direct control of the inspection apparatus 100 as desired and view images obtained by the camera 120, as well as obtain other information and/or data from the inspection apparatus 100, for example, such as positional information indicating (a) the degree or amount to which the lift device 110 has been extended and/or retracted and/or (b) the degree or amount to which the camera 120 has been rotated, panned and/or tilted. Suitably, this positional information is obtained and/or otherwise derived from readings (i.e., signals) provided by corresponding sensors 216 and 226 that effectively measure the same, for example, by monitoring the respective actuators 214 and 222. For example, either or both of the sensors 216 and 226 may comprise rotary encoders or the like which monitor and/or measure the rotation of the respective motors 114 and 122. In one suitable embodiment, either or both of the motors 114 and 122 may comprise stepper motors, such that their rotational position and/or orientation is known and/or recorded based on the number of steps each motor is driven to take.

In the illustrated wireless communication embodiment, the inspection apparatus 100 is suitably provisioned with its own on-board power supply 240 (for example, a battery) for driving the actuators 214 and 222. In other suitable embodiments, for example, employing wired communication, the power supply 240 may be remotely located from the inspection apparatus 100 and the power therefrom may be operatively supplied to the actuators 214 and 222 via a wired connection (e.g., an electric power cord).

As shown in FIG. 6, video and/or still image data from the videos and/or images captured by the camera 120 are optionally stored and/or otherwise maintained in an image database (DB) 300, optionally along with associated positional and/or orientation information and/or data, for example, obtained and/or derived from the respective sensors 216 and 226. In this way, the position and/or orientation of the camera 120 may be recorded and/or maintained along with the video or image data obtained by the camera 120 when the camera 120 is at that given position and/or orientation. The controller 210 may selectively access the information and/or data maintained in the DB 300 and provide the same (or a suitable representation thereof) on an output device of the user interface 212. In practice, the DB 300 may be implemented via and/or maintained on an appropriate computer and/or electronic memory, data storage medium or any suitable data storage device.

In suitable embodiments, the controller 210 controls and/or otherwise regulates operation of the inspection apparatus 100, for example, (a) by extending and/or retracting the lift device 110 via suitable driving of the lift actuator 214 and/or motor 114, (b) by rotating the camera 120 and/or its FoV via suitable driving of the camera orientation actuator 222 and/or motor 122, and/or (c) by directing the camera 120 to capture video while the camera 120 is in motion and/or to capture video or still images at designated positions and/or orientations of the camera 120.

In suitable embodiments, the controller 210 is programmed to conduct a preset or otherwise determined inspection routine. That is to say, the movement and/or orientation of the camera 120 is suitably directed along a preset or otherwise determined path via appropriate driving of the respective actuators 214 and 222 such that the FoV of the camera 120 suitably sweeps over and/or intermittently points at one or more parts, components and/or regions of the EUV light source 10 to be inspected, for example, such as the IF cap 20, the walls of the vessel 12 and/or interior vanes thereon, the HO bar 40, the scrubber 50, the port 14a, the droplet catcher 16, etc. In some suitable embodiments, video images are captured by the camera 120 while it is in motion. In some suitable embodiments, one or more still images are captured by the camera 120 while the camera 120 is stationary at one or more designated distances from the base 112 (i.e., in accordance with the amount by which the lift device 110 has been extended and/or retracted) and at one or more designated rotational orientations about the camera's axis of rotation (i.e., in accordance with the operation of the camera orientation actuator 222 and/or motor 122). In some such embodiments, the inspection apparatus may not be remotely controlled, or may be remotely controlled only in a "start/stop" fashion. For example, the inspection apparatus may have an on-board controller that is preprogrammed with the preset inspection routine which is manually triggered to start either remotely or by the operator pressing a "start" button (or the like) disposed directly on the inspection apparatus.

In some embodiments, an ad hoc inspection routine is conducted by the inspection apparatus 100 under the control and/or regulation of the controller 210. In such instances, an operator may manually enter and/or otherwise input control commands and/or instructions via the user interface 212 to manipulate the inspection apparatus 100 accordingly as desired, for example, to control the extension and/or retraction of the lift device 110 via suitable driving of the lift actuator 214 and/or motor 114, to control the orientation of the camera 120 and/or its FoV via suitable driving of the camera orientation actuator 222 and/or motor 122, and/or to control operation of the camera 120 to capture video while the camera 120 is in motion and/or to capture video or still images at designated positions and/or orientations of the camera 120.

In some suitable embodiments, the controller 210 is programmed with certain limits that restrict operation of the inspection apparatus 100. Suitably, these limits may restrict the amount the lift device 110 may be extended and/or the amount the camera 120 may be rotated. In this way, the inspection apparatus 100 is effectively inhibited or barred from being operated in a way that might cause a part or component of the inspection apparatus 100 from coming into contact with and/or potentially marring or damaging a part or component of the EUV light source 10. For example, the controller 210 is optionally programmed with limits that restrict the lift device 100 from being extended so far that the HO bar 40 of the EUV light source 10 is struck by the camera 120 or another part or component of the inspection apparatus 100. Additionally or alternatively, the inspection apparatus 100 may optionally include a proximity sensor or sensors (not shown) that abort extension of the lift if a proximity sensor detects an imminent collision with an interior component or wall of the EUV light source.

Figure 7:
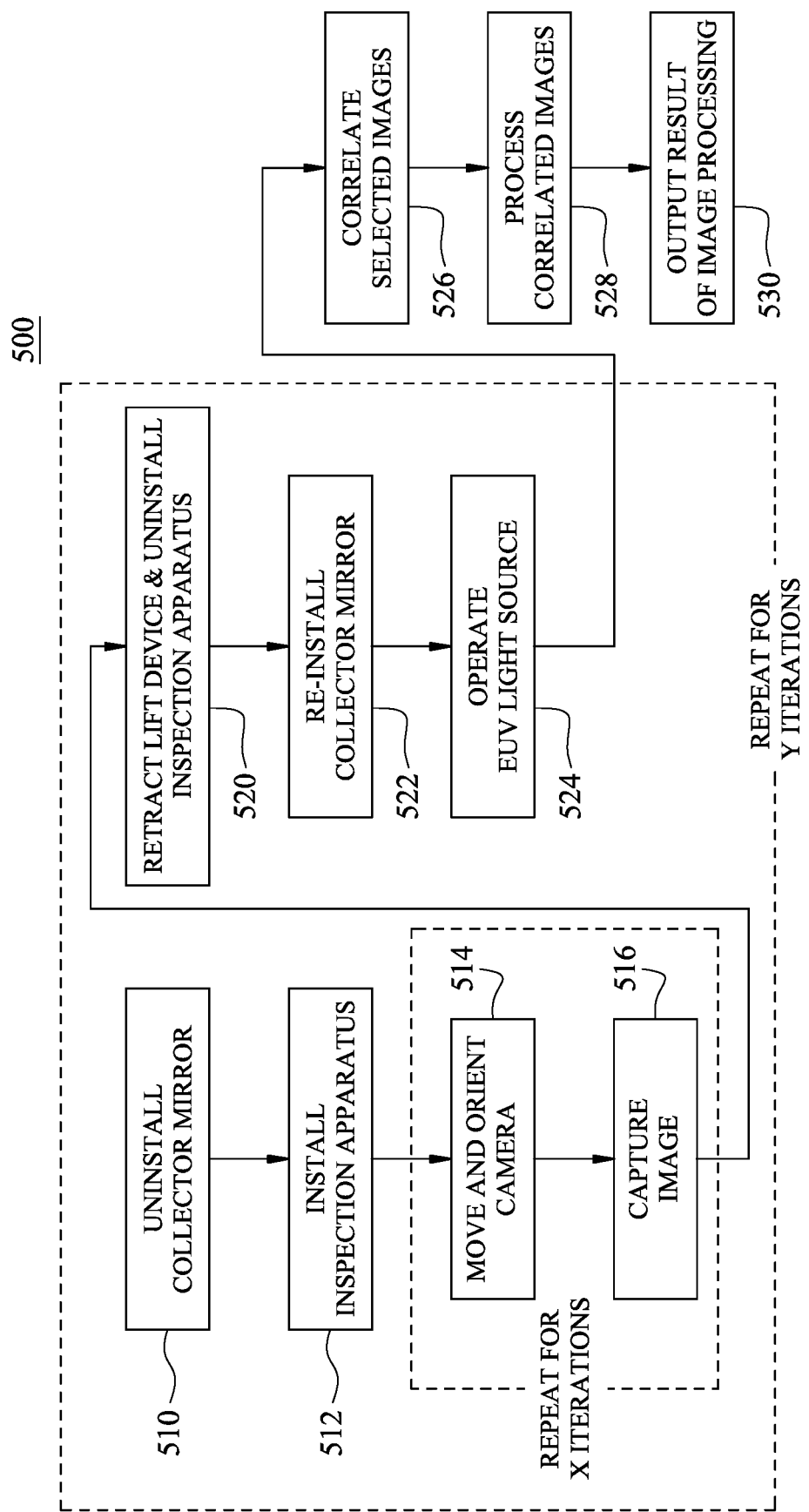
FIG. 7 is a flow chart showing a method and/or process for inspecting a EUV light source in accordance with some embodiments.

With reference to FIG. 7, there is shown a flow-chart that illustrates an exemplary process 500, in accordance with some embodiments disclosed herein, for conducting inspections of the EUV light source 10 with the inspection apparatus 100 and/or system 200. For illustrative purposes herein, at the start of the inspection process 500, it is assumed that the EUV light source 10 has the drawer containing the collector mirror 32 installed and/or otherwise in placed in the collector chamber 30.

At an initial step 510, the drawer containing the collector mirror 32 is removed from the collector chamber 30.

At step 512, the inspection apparatus 100 is placed in the collector chamber 30, for example, with the base 112 of the inspection apparatus 100 resting on the floor 30a of the collector chamber 30. In some embodiments, the base 112 of the inspection apparatus 100 is aligned with registration marks on the floor 30a of the collector chamber 30. In some embodiments, the base 112 of the inspection apparatus 100 is removably secured to the floor 30a of the collector chamber 30, for example, via a mechanical, magnetic, adhesive, suction or other appropriate mechanism. As previously noted herein, in some suitable embodiments, one or more detents, mated pins and/or holes, tabs, retaining members, connectors and/or other positioning devices are included on the floor 30a and/or base 112, which act and/or cooperate to position and/or selectively retain the base 112 of the inspection apparatus 100 in a set location on the floor 30a of the collector chamber 30. Suitably, when installing the inspection apparatus 100 in the collector chamber 30 during step 512, the lift device 110 is in its fully retracted or nearly fully retracted state.

At step 514, the camera 120 is moved to and/or positioned at a given location and orientation, for example, via suitable operation and/or control of the actuators 214 and 222.

At step 516, the camera 120 is signaled and/or otherwise controlled to capture an image of the part(s) or component(s) of the EUV light source 10 within its FoV. Suitably, the corresponding image data may be stored in the image DB 300. In some suitable embodiments, the position and/or orientation of the camera 120 when the image is being captured is simultaneously or otherwise noted and recorded, for example, along with the associated image data. For example, the position and/or orientation of the camera 120 is suitably known, determined and/or derived in accordance with information and/or data obtained from the sensors 216 and 226, or otherwise.

As shown in FIG. 7, steps 514 and 516 may be optionally repeated with the position and/or orientation of the camera 120 being changed on each repetition in order to inspect different parts, components and/or regions of the EUV light source 10 with successive iterations.

After completion of the last iteration of steps 514 and 516, at step 520, the lift device 110 is retuned to a fully or nearly fully retracted state, for example, via suitable control and/or operation of the lift actuator 214, and the inspection apparatus 100 is removed from the collector chamber 30.

At step 522, the drawer containing the collector mirror 32 is replaced in the collector chamber 30, thereby re-installing the collector mirror 32 in position for normal operation of the EUV light source 10.

At step 524, the EUV light source 10 is operated as usual, for example, as discussed above herein.

As shown in FIG. 7, steps 510 through 524 of the process 500 are optionally repeated as desired to periodically and/or intermittently inspect the EUV light source 10 between uses thereof.

In some suitable embodiments, image data obtained during one inspection iteration may be compared to image data obtained during a subsequent or other inspection iteration and changes in the compared image data suitably noted.

In some suitable embodiments, as shown in FIG. 7, at step 526, the recorded camera position and/or orientation data associated with given sets of image data, for example, in the DB 300, are used to correlate a first image obtained during one inspection iteration with a second image obtained during a subsequent or other inspection iteration. That is to say, insomuch as the inspection apparatus 100 is reliably and/or repeatably located at the same position (for example, on the floor 30a of the collector chamber 30) for each inspection iteration, and the position and orientation of the camera 120 is known, derived and/or recorded (for example, from data and/or information obtained via the sensors 216 and 226, or otherwise) for each captured image, it is to be appreciated that when the first image and the second image were captured by the camera 120, the camera 120 was essentially in the same position and had essentially the same orientation, i.e., the FoV of the camera 120 in both instances was essentially the same, therefor, these first and second images may be correlated at step 526.

In some suitable embodiments, at step 528, the first and second correlated images are compared to one another, for example, via suitable image processing and/or analysis. For example, the images may be registered with and/or laid over one another and suitable image subtraction may be performed to highlight changes that may have occurred between when the first and second images were captured. It is to be appreciated that such highlighted changes can generally indicate where target material residue and/or other contaminates have been deposited and/or build-up on interior part(s) and/or components(s) of the EUV light source 10 inspected by and/or with the inspection apparatus 100 and/or inspection system 200. Likewise, damage to such interior part(s) and/or component(s) may also be detected in this fashion.

At step 530, a result of the image processing and/or analysis is suitably output, for example, on an output device of the user interface 212. Optionally, the result of the image processing and/or analysis may also be stored and/or maintained in the image DB 300. Suitably, the displayed or otherwise output result may then be employed to inform an operator of the inspection apparatus 100 and/or inspection system 200 where cleaning and/or maintenance of the EUV light source 10 is to be directed. In some embodiments, further analysis of the result, for example, by the controller 210, may be performed to deduce or otherwise derive potential operational faults and/or other operational parameters of the EUV light source 10, for example, that instigated the changes highlighted.

Although described in conjunction with inspecting an EUV light source, it is contemplated to deploy the disclosed inspection apparatus 100 for inspection of other types of process chambers, such as EUV scanners, for which physical access to acquire inspection images using a manually handled rod-mounted camera is difficult.

In accordance with one embodiment, a method of inspecting an interior chamber of an extreme ultraviolet (EUV) light source is provided. The method includes: removing a collector mirror of the EUV light source from a collector chamber in which the collector mirror is housed during operation of the EUV light source; installing an inspection apparatus within the collector chamber, the apparatus including a selectively extendable and retractable member and a camera arranged at one end of the member; operating a first actuator to extend the member along a path through the interior chamber of the EUV light source, thereby moving the camera to a given position within the interior chamber of the EUV light source; operating a second actuator to pan the camera about an axis of rotation, thereby establishing a given orientation of the camera within the interior chamber of the EUV light source; and, capturing a first image of the interior chamber of the EUV light source with the camera while the camera is at the given position and given orientation established by the operation of the first and second actuators.

In accordance with a further embodiment, the method further includes, after the capturing of the first image: operating the first actuator to retract the member; and removing the inspection apparatus from the collector chamber.

In accordance with yet a further embodiment, the method further includes, after the removing of the inspection apparatus: replacing the collector mirror of the EUV light source in the collector chamber; and, operating the EUV light source.

In accordance with still a further embodiment, the method further includes, after the operating of the EUV light source: again removing the collector mirror of the EUV light source from the collector chamber; re-installing the inspection apparatus within the collector chamber; again operating the first actuator to extend the member along the path through the interior chamber of the EUV light source, thereby again moving the camera to the given position within the interior chamber of the EUV light source, wherein the first actuator is again remotely operated from outside of the interior chamber of the EUV light source and outside of the collector chamber; again operating the second actuator to pan the camera about the axis of rotation, thereby re-establishing the given orientation of the camera within the interior of the EUV light source, wherein the second actuator is again remotely operated from outside of the interior chamber of the EUV light source and outside of the collector chamber; and, capturing a second image of the interior chamber of the EUV light source with the camera while the camera is again at the given position and given orientation established by the operation of the first and second actuators.

In accordance with a further embodiment, the method further includes: comparing the first and second images to one another in order to detect differences therebetween.

In accordance with a further embodiment, the comparing comprises performing image processing on the first and second images, the image processing including image subtraction.

In accordance with a further embodiment, at least one of operating the first actuator and operating the second actuator includes energizing an electric motor.

In accordance with a further embodiment, the method includes monitoring at least one of the first actuator and the second actuator with a sensor that measures an amount by which said actuator is operated.

In accordance with yet a further embodiment, installing of the inspection apparatus includes removably securing the inspection apparatus to a surface of the collector chamber.

In still a further embodiment, installing of the inspection apparatus includes at least one of aligning and registering the inspection apparatus with a designated location on a surface of the collector chamber.

In still a further embodiment, the operating of at least one of the first actuator and the second actuator is remotely controlled from outside the interior chamber of the EUV light source and outside the collector chamber.

In accordance with another embodiment, a remotely controlled inspection apparatus is provided for inspecting an interior chamber of an extreme ultraviolet (EUV) light source. Suitably, the apparatus includes: a base configured to rest at a designated location on a surface of the EUV light source; a lift device supported on the base, said lift device being selectively extendable and retractable; a first actuator selectively drivable to extend and retract the lift device along a path through the interior chamber of the EUV light source; a camera arranged on an end of the lift device opposite the base; and, a second actuator selectively drivable to pan the camera about an axis of rotation. Suitably, the first and second actuators and the camera of the inspection apparatus are remotely controlled from outside the interior chamber of the EUV light source such that the camera is directed to capture an image of the interior chamber of the EUV light source while the camera is at a position and an orientation established by operation of the first and second actuators.

In accordance with a further embodiment, at least one of the first and second actuators is an electric motor.

In another embodiment, the inspection apparatus includes at least one sensor that monitors operation of at least one of the first and second actuators such that at least one of the position and the orientation of the camera is at least one of known or derived from data obtained by the at least one sensor.

In accordance with a further embodiment, the surface of the EUV light source on which the base rests is a surface of a collector chamber that contains a collector mirror of the EUV light source when the EUV light source is in operation.

In accordance with a further embodiment, the base includes at least one connection device that acts to removably secure the base to the surface upon which the base rests.

In accordance with still a further embodiment, base includes at least one alignment device that cooperates with at least one alignment device on the surface of the EUV light source so as to position the base at the designated location.

In yet another embodiment, a method is provided for inspecting an interior chamber of an extreme ultraviolet (EUV) light source with an inspection system. The method includes: placing an inspection apparatus of the inspection system in the interior chamber of the EUV light source, the inspection apparatus having a selectively extendable and retractable member and a camera arranged at an end of the member; activating a first actuator to selectively extend and retract the member along a path through the interior chamber of the EUV light source; activating a second actuator to selectively pan the camera about an axis of rotation; and remotely communicating with the inspection apparatus to remotely regulate the activating of the first and second actuators and remotely regulate operating the camera, thereby causing operation of the camera of the inspection apparatus such that the camera is directed to capture an image of the interior chamber of the EUV light source while the camera is at a position and an orientation established by the activating of the first and second actuators.

In accordance with a further embodiment, the communicating includes: sending control signals via a first transceiver, the control signals regulating the activating and operating of at least one of the first actuator, the second actuator and the camera; and receiving the control signals via a second transceiver provisioned at the inspection apparatus.

In yet one further embodiment, the method includes maintaining image data corresponding to the captured image in an image database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of inspecting an interior chamber of an extreme ultraviolet (EUV) light source, said method comprising:
   removing a collector mirror of the EUV light source from a collector chamber in which the collector mirror is housed during operation of the EUV light source;
   installing an inspection apparatus within the collector chamber, said apparatus including a selectively extendable and retractable member and a camera arranged at one end of the member;
   operating a first actuator to extend the member along a path through the interior chamber of the EUV light source, thereby moving the camera to a given position within the interior chamber of the EUV light source;
   operating a second actuator to pan the camera about an axis of rotation, thereby establishing a given orientation of the camera within the interior chamber of the EUV light source; and,
   capturing a first image of the interior chamber of the EUV light source with the camera while the camera is at the given position and given orientation established by the operation of the first and second actuators.

2. The method of claim 1, said method further comprising, after said capturing of the first image:
   operating the first actuator to retract the member; and
   removing the inspection apparatus from the collector chamber.

3. The method of claim 2, said method further comprising, after said removing of the inspection apparatus:
   replacing the collector mirror of the EUV light source in the collector chamber; and
   operating the EUV light source.

4. The method of claim 3, said method further comprising, after said operating of the EUV light source:
   again removing the collector mirror of the EUV light source from the collector chamber;
   re-installing the inspection apparatus within the collector chamber;
   again operating the first actuator to extend the member along the path through the interior chamber of the EUV light source, thereby again moving the camera to the given position within the interior chamber of the EUV light source;
   again operating the second actuator to pan the camera about the axis of rotation, thereby re-establishing the given orientation of the camera within the interior of the EUV light source; and,
   capturing a second image of the interior chamber of the EUV light source with the camera while the camera is again at the given position and given orientation established by the operation of the first and second actuators.

5. The method of claim 4, further comprising:
   comparing the first and second images to one another in order to detect differences therebetween.

6. The method of claim 5, wherein said comparing comprises performing image processing on the first and second images, said image processing including image subtraction.

7. The method of claim 1, wherein at least one of operating the first actuator and operating the second actuator comprises energizing an electric motor.

8. The method of claim 1, further comprising:
   monitoring at least one of the first actuator and the second actuator with a sensor that measures an amount by which said actuator is operated.

9. The method of claim 1, wherein said installing of the inspection apparatus comprise removably securing the inspection apparatus to a surface of the collector chamber.

10. The method of claim 1, wherein said installing of the inspection apparatus comprises at least one of aligning and registering the inspection apparatus with a designated location on a surface of the collector chamber.

11. The method of claim 1, wherein the operating of at least one of the first actuator and the second actuator is remotely controlled from outside the interior chamber of the EUV light source and outside the collector chamber.

12. A remotely controlled inspection apparatus for inspecting an interior chamber of an extreme ultraviolet (EUV) light source, said inspection apparatus comprising:
   a base configured to rest at a designated location on a surface of the EUV light source;
   a lift device supported on the base, said lift device being selectively extendable and retractable;
   a first actuator selectively drivable to extend and retract the lift device along a path through the interior chamber of the EUV light source;
   a camera arranged on an end of the lift device opposite the base; and
   a second actuator selectively drivable to pan the camera about an axis of rotation;
   wherein the first and second actuators and the camera of the inspection apparatus are remotely controlled from outside the interior chamber of the EUV light source such that the camera is directed to capture an image of the interior chamber of the EUV light source while the camera is at a position and an orientation established by operation of the first and second actuators.

13. The inspection apparatus of claim 12, wherein at least one of the first and second actuators is an electric motor.

14. The inspection apparatus of claim 12, further comprising:
   at least one sensor that monitors operation of at least one of the first and second actuators such that at least one of the position and the orientation of the camera is at least one of known or derived from data obtained by the at least one sensor.

15. The inspection apparatus of claim 12, wherein:
the surface of the EUV light source on which the base rests is a surface of a collector chamber that contains a collector mirror of the EUV light source when the EUV light source is in operation.

16. The inspection apparatus of claim 12, wherein:
the base includes at least one connection device that acts to removably secure the base to the surface upon which the base rests.

17. The inspection apparatus of claim 12, wherein:
the base includes at least one alignment device that cooperates with at least one alignment device on the surface of the EUV light source so as to position the base at the designated location.

18. A method for inspecting an interior chamber of an extreme ultraviolet (EUV) light source with an inspection system, said method comprising:
placing an inspection apparatus of the inspection system in the interior chamber of the EUV light source, said inspection apparatus having a selectively extendable and retractable member and a camera arranged at an end of the member;
activating a first actuator to selectively extend and retract the member along a path through the interior chamber of the EUV light source;
activating a second actuator to selectively pan the camera about an axis of rotation; and
remotely communicating with the inspection apparatus to remotely regulate the activating of the first and second actuators and remotely regulate operating the camera, thereby causing operation of the camera of the inspection apparatus such that the camera is directed to capture an image of the interior chamber of the EUV light source while the camera is at a position and an orientation established by the activating of the first and second actuators.

19. The method of claim 18, wherein said communicating comprises:
sending control signals via a first transceiver, said control signals regulating the activating and operating of at least one of the first actuator, the second actuator and the camera; and
receiving said control signals via a second transceiver provisioned at the inspection apparatus.

20. The method of claim 18, further comprising:
maintaining image data corresponding to the captured image in an image database.

* * * * *